United States Patent
Sul et al.

(10) Patent No.: US 7,042,312 B2
(45) Date of Patent: May 9, 2006

(54) LADDER-TYPE BULK ACOUSTIC WAVE FILTER WITH COMMON GROUND INDUCTOR

(75) Inventors: Sang Chul Sul, Kyungki-do (KR); Jea Shik Shin, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 19 days.

(21) Appl. No.: 10/790,011

(22) Filed: Mar. 2, 2004

(65) Prior Publication Data

US 2005/0073377 A1    Apr. 7, 2005

(30) Foreign Application Priority Data

Oct. 7, 2003    (KR) ............... 10-2003-0069496

(51) Int. Cl.
H03H 9/54    (2006.01)
H03H 9/56    (2006.01)
(52) U.S. Cl. .................... 333/187; 333/189
(58) Field of Classification Search ....... 333/187–192, 333/133
See application file for complete search history.

(56) References Cited

U.S. PATENT DOCUMENTS 5,231,327 A * 7/1993 Ketcham ............. 310/366
6,323,744 B1  11/2001 Barber et al. ......... 333/189
2003/0186673 A1* 10/2003 Kimachi et al. ....... 455/339
2005/0093648 A1*  5/2005 Inoue .................. 333/133

FOREIGN PATENT DOCUMENTS

JP    10-093382    4/1998

OTHER PUBLICATIONS

C.W. Seabury et al., "Thin Film ZnO Based Bulk Acoustic Mode Filters", IEEE 1997 Microwave Symposium Digest, Jun. 1997, vol. 1, pp. 181-184.*

* cited by examiner

Primary Examiner—Barbara Summons
(74) Attorney, Agent, or Firm—Lowe Hauptman & Berner, LLP (57) ABSTRACT

A ladder-type bulk acoustic wave filter includes an input terminal, an output terminal, a ground terminal, a plurality of series resonators connected in series between the input terminal and the output terminal, a plurality of shunt resonators, and a common ground inductor. Each shunt resonator has a first end and a second end. Each of the first ends of the shunt resonators is connected to a contact point of the series resonators. The second ends of the shunt resonators are commonly connected to a common terminal. The common ground inductor connects the common terminal of the shunt resonators to the ground terminal.

5 Claims, 8 Drawing Sheets

PRIOR ART

FIG. 1

PRIOR ART

FIG. 2

PRIOR ART

FIG. 3

PRIOR ART

LADDER-TYPE BULK ACOUSTIC WAVE FILTER WITH COMMON GROUND INDUCTOR

BACKGROUND OF THE INVENTION

1. Field of the Invention

The present invention relates, in general, to ladder-type bulk acoustic wave filters and, more particularly, to a ladder-type bulk acoustic wave filter with a common ground inductor, which obtains high attenuation in a high frequency stop band adjacent to a pass band without the insertion loss degradation of the pass band, so that the ladder-type bulk acoustic wave filter is useful as a transmission stage filter.

2. Description of the Related Art

Recently, with the development of mobile communication technology and the popularization of mobile communication terminals, the small-size and light weight of the parts of mobile terminals are required.

To comply with the requirements, for a filter that is one of important passive parts of the mobile terminals, a conventional bulk ceramic filter has been replaced by a more smaller surface acoustic wave filter or bulk acoustic wave filter.

Especially, there has been further popularized the bulk acoustic wave filter that has been found to have a low loss, a high selection ratio, and high power durability properties compared to the surface acoustic wave filter, and to be able to meet ultrahigh frequencies up to 10 GHz.

Such a bulk acoustic wave filter is implemented in such a way that a plurality of Film Bulk Acoustic Resonators (FBARs) are connected to each other. Bulk acoustic wave filters have been classified into a ladder-type filter in which a plurality of resonators are electrically connected and a stacked crystal filter in which a plurality of resonators are mechanically connected, and researched thereby.

Figure 1:
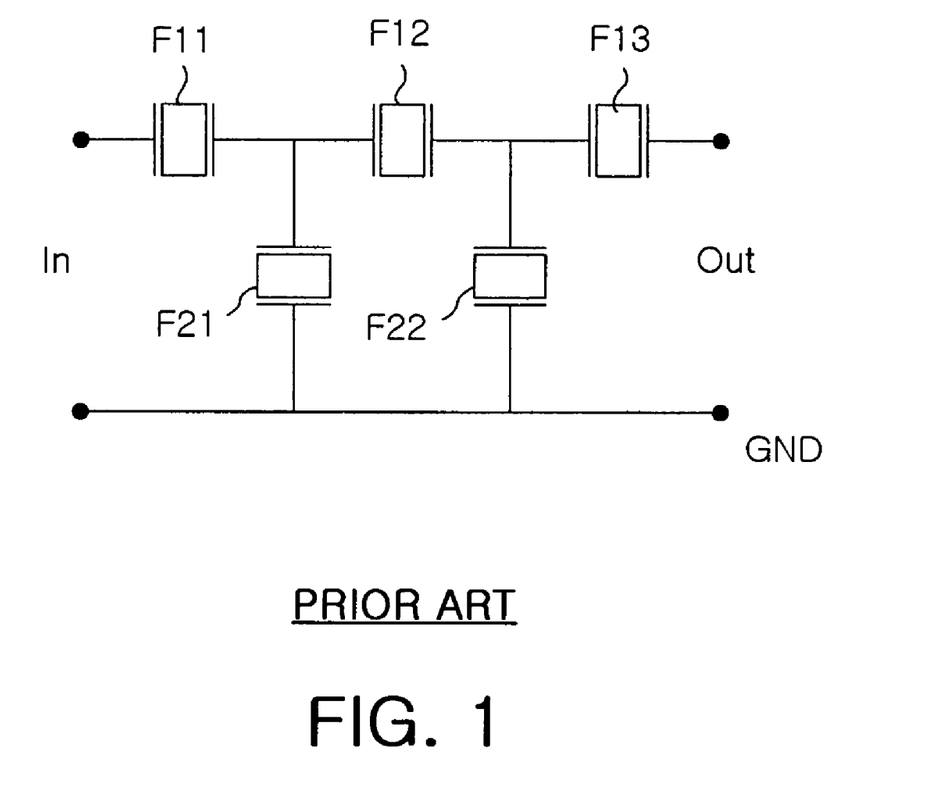
FIG. 1 is an equivalent circuit diagram of a ladder-type bulk acoustic wave filter.

In the above filters, the ladder-type filter is first commercialized. As shown in FIG. 1, the ladder-type filter is constructed so that a plurality of resonators F11 to F13 are arranged in series between an input terminal IN and an output terminal OUT, and resonators F21 and F22 are arranged between contact points of the respective resonators F11 to F13 and a ground terminal GND. In this case, the resonators F11 to F13 arranged in series with the input terminal IN and the output terminal OUT are designated as series resonators, and the resonators F21 and F22 connected to the ground GND are designated as shunt resonators.

In the above description, all of the resonators F11 to F13, F21 and F22 have different resonant frequencies designed to correspond to respective required pass bands. Generally, the series resonators are designed to have resonant frequencies higher than those of the shunt resonators by approximately 3% of a center frequency. Further, the series and shunt resonators show band pass characteristics with respect to certain frequency bands by generated poles and zeros.

Figure 2:
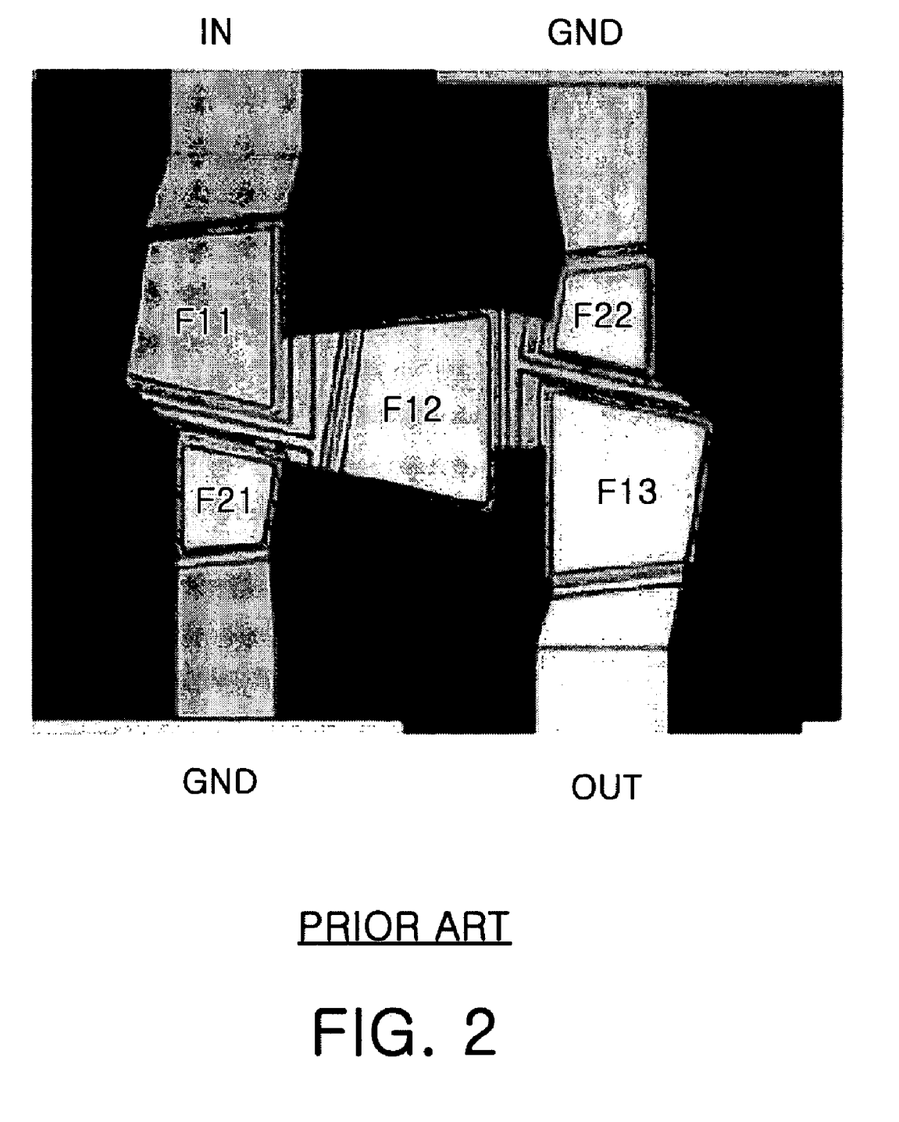
FIG. 2 is a top view of the ladder-type bulk acoustic wave filter.

FIG. 2 is an enlarged top view showing an actual bulk acoustic wave filter implemented using the circuit of FIG. 1, wherein series resonators F11, F12 and F13 are sequentially arranged and connected between input and output terminals IN and OUT, and shunt resonators F21 and F22 are arranged between the series resonators F11, F12 and F13 and the ground terminal GND.

Figure 3:
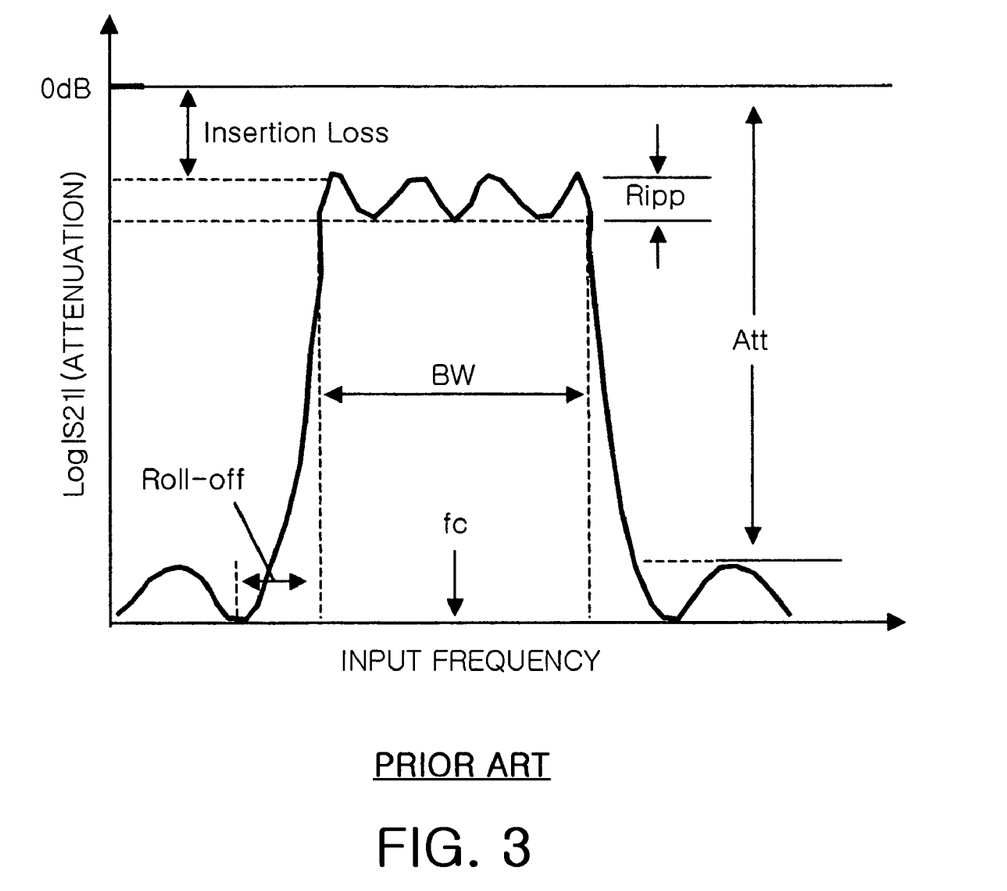
FIG. 3 is a graph showing the typical characteristic parameters of a band pass filter.

Generally, as shown in FIG. 3, there are several factors representing the characteristics of a band pass filter, such as a center frequency fc, which is a center frequency value of a pass band, a bandwidth (BW) of the pass band, roll-off (Roll-off) representing an interval between a 3 dB attenuation point and a pole, a signal insertion loss (Loss) representing an average loss of the pass band, ripple (Ripp) representing the amplitude of a ripple component appearing in the pass band, and an attenuation ratio (Att) representing the attenuation of a signal existing outside the pass band.

In this case, as the insertion loss (Loss), the roll-off (Roll-off) and the ripple (Ripp) are smaller and the attenuation ratio (Att) is larger, the desirable characteristics of the band pass filter are obtained.

Figure 4:
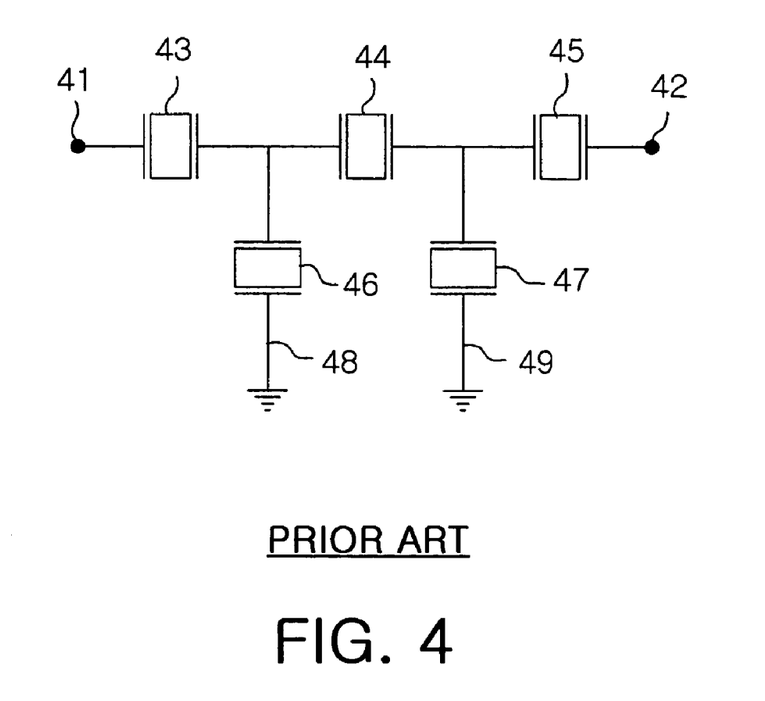
FIG. 4 is a circuit diagram showing an example of a conventional ladder-type bulk acoustic wave filter.

The characteristics of the conventional bulk acoustic wave filter are described on the basis of the above factors. That is, as shown in FIG. 4, the conventional bulk acoustic wave filter is constructed in such a way that shunt resonators 46 and 47 are grounded through respective bonding wires 48 and 49 when a plurality of resonators 43 to 47 are connected in a T-shape between an input terminal 41 and an output terminal 42.

In this way, if ground paths between the shunt resonators 46 and 47 are isolated from each other, attenuation characteristics can be somewhat improved in a low frequency stop band adjacent to a pass band. However, the attenuation characteristics are not significantly improved in a high frequency stop band. Therefore, the conventional bulk acoustic wave filter is not suitable for a transmission stage filter requiring high attenuation in the high frequency stop band.

SUMMARY OF THE INVENTION

Accordingly, the present invention has been made keeping in mind the above problems occurring in the prior art, and an object of the present invention is to provide a ladder-type bulk acoustic wave filter with a common ground inductor, which obtains high attenuation in a high frequency stop band adjacent to a pass band without the insertion loss degradation of the pass band, so that the ladder-type bulk acoustic wave filter is useful as a transmission stage filter.

In order to accomplish the above object, the present invention provides a ladder-type bulk acoustic wave filter, comprising an input terminal for receiving an electrical signal including a certain frequency signal; an output terminal for outputting an electrical signal with a frequency within a predetermined pass band; a ground terminal connected to ground; a plurality of series resonators connected in series between the input terminal and the output terminal; a plurality of shunt resonators each comprised of a piezoelectric layer and top and bottom electrodes formed on the piezoelectric layer to input/output electrical signals, the shunt resonators each comprised of a piezoelectric layer and top and bottom electrodes formed on the piezoelectric layer to input/output electrical signals, the shunt resonators having first ends each connected to an arbitrary contact point of the plurality of series resonators and second ends commonly connected to each other; and a common ground inductor for connecting a common terminal of the plurality of shunt resonators to the ground terminal.

Preferably, in the ladder-type bulk acoustic wave filter, the common ground inductor may have an inductance of approximately 1 nH or less.

Preferably, in the ladder-type bulk acoustic wave filter, the common ground inductor may be implemented by a labyrinthine or spiral conductive pattern formed on a chip of the bulk acoustic wave filter.

Preferably, in the ladder-type bulk acoustic wave filter, the common ground inductor may be implemented by a conductive pattern formed on a package of the bulk acoustic wave filter or a printed circuit board on which the bulk acoustic wave filter is mounted.

Preferably, in the ladder-type bulk acoustic wave filter, the common ground inductor may be implemented by a bonding wire for connecting the common terminal of the plurality of shunt resonators to a ground terminal of a printed circuit board on which the bulk acoustic wave filter is mounted.

Preferably, in the ladder-type bulk acoustic wave filter, the common ground inductor may be implemented by a lumped element.

Preferably, the ladder-type bulk acoustic wave filter may be implemented so that four series resonators are connected in series between the input and output terminals; and three shunt resonators are each connected to a contact point of any two of the four series resonators.

Preferably, the ladder-type bulk acoustic wave filter may be implemented so that first to fourth series resonators are sequentially connected in series between the input and output terminals; and first and second shunt resonators are connected to a first contact point of the input terminal and the first series resonator and a second contact point of the second and third series resonators, respectively.

BRIEF DESCRIPTION OF THE DRAWINGS

The above and other objects, features and other advantages of the present invention will be more clearly understood from the following detailed description taken in conjunction with the accompanying drawings, in which:

FIG. 8b is a graph showing the frequency characteristics of the ladder-type bulk acoustic wave filter of FIG. 8a.

DESCRIPTION OF THE PREFERRED EMBODIMENTS

Hereinafter, embodiments of the present invention will be described in detail with reference to the attached drawings.

Figure 5:
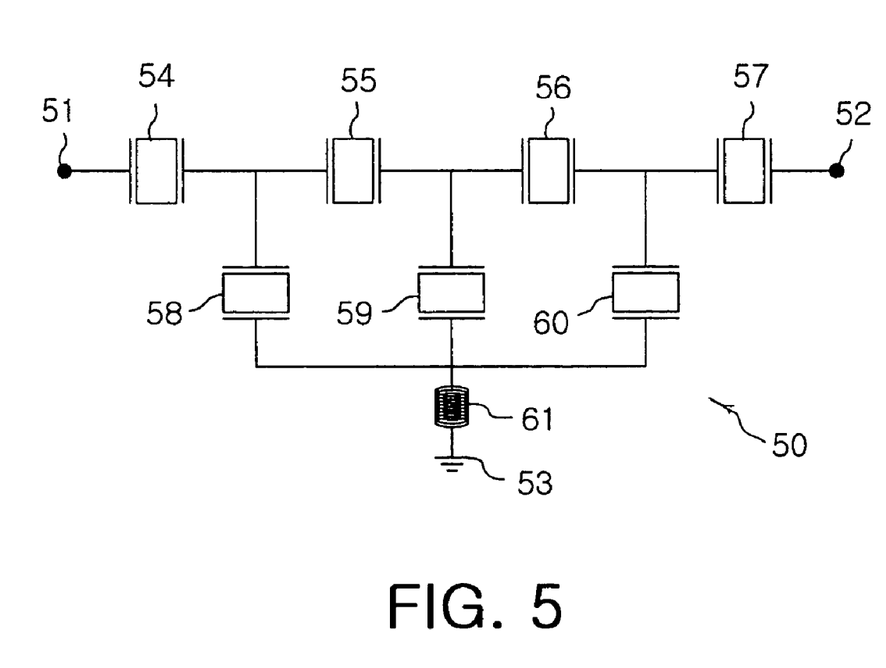
FIG. 5 is a circuit diagram showing the construction of a ladder-type bulk acoustic wave filter according to an embodiment of the present invention.

FIG. 5 is a circuit diagram of a ladder-type bulk acoustic wave filter according to a first embodiment of the present invention.

A ladder-type bulk acoustic wave filter 50 of FIG. 5 includes an input terminal 51 for receiving an electrical signal with a certain frequency, an output terminal 52 for outputting an electrical signal including only a passed frequency component within a pass band, a ground terminal 53 connected to ground, first to fourth series resonators 54 to 57 connected in series between the input and output terminals 51 and 52, first to third shunt resonators 58 to 60 having one ends each connected to a contact point of any two of the first to fourth series resonators 54 to 57 and the remaining ends commonly connected to each other, and an inductor 61 for connecting a commonly connected terminal of the first to third shunt resonators 58 to 60 to the ground terminal 53.

In the above construction, each of first to fourth series resonators 54 to 57 and the first to third shunt resonators 58 to 60 is a film bulk acoustic resonator (FBAR) in which a piezoelectric dielectric material, such as a ZnO or AlN film, is formed on a semiconductor substrate (wafer), such as silicon or GaAs substrate, to cause resonance due to the piezoelectric characteristics of the film. Each of the resonators 54 to 60 is constructed in such a way that a first electrode, a piezoelectric layer and a second electrode are sequentially superposed on the silicon or GaAs substrate. In addition, each of the resonators 54 to 60 may include a structure (for example, a reflection film structure and an air gap structure) for isolating a resonance area comprised of the first electrode, the piezoelectric layer and the second electrode from the substrate so as to prevent a bulk acoustic wave generated in the piezoelectric layer from being influenced by the substrate. Moreover, the first to fourth resonators 54 to 57 and the first to third shunt resonators 58 to 60 may have different resonant frequencies. Further, the band pass characteristics of the resonators 54 to 60 are determined according to poles and zeros generated by the filters 54 to 60.

Further, the remaining ends of the first to third shunt resonators 58 to 60 are commonly connected to one end of the inductor 61 and are connected to the ground terminal 53 through the inductor 61.

The inductor 61 has an inductance of approximately 1 nH or less.

The inductor 61 having an inductance of approximately 1 nH or less can be implemented by a labyrinthine or spiral conductive pattern formed on a surface of a chip of the bulk acoustic wave filter or within the chip. In this case, the bulk acoustic wave filter chip can be used, with the ground terminal of the bulk acoustic wave filter chip being directly bonded to a bonding pad for grounding on a printed circuit board (PCB). Therefore, the bulk acoustic wave filter chip can be implemented without a significant increase in the size thereof.

Further, the inductor 61 can be implemented by an embedded conductive pattern (strip line) formed on a package in which the bulk acoustic wave filter is packaged, or a PCB on which the bulk acoustic wave filter is mounted. In the case where the inductor 61 is implemented by the embedded conductive pattern formed on the package, one ends of the first to third shunt resonators are commonly connected to each other on the bulk acoustic wave filter chip, and the commonly connected terminal is connected to the inductor 61 formed on the package. At this time, the ground terminal 53 is also formed on the package and connected to the inductor 61. Further, in the case where the inductor 61 is implemented by the embedded pattern formed on the PCB, the first to third shunt resonators 58 to 60 are implemented on the bulk acoustic wave filter chip and are connected to the ground terminal of the PCB through the inductor 61 formed on the PCB.

Further, when the common terminal of the plurality of shunt resonators 58 to 60 is wire bonded and connected to a ground terminal of the PCB on which the bulk acoustic wave filter is mounted, the inductor 61 can be implemented using a bonding wire used for the wire bonding. As described above, because the inductance of the inductor 61 is approximately 1 nH or less, the inductor 61 can be implemented by adjusting the length of the bonding wire. In this case, an additional construction is not required compared to the conventional bulk acoustic wave filter, so that the size of the filter is not increased.

Further, the inductor 61 can be implemented by mounting a lumped element, such as a chip inductor or coil, on a PCB and then electrically connecting the element to the bulk acoustic wave filter on the PCB.

EXPERIMENT EXAMPLE 1

A transmission stage filter for Personal Communication Systems (PCSs) having a center frequency of 1880 MHz and a bandwidth of 60 MHz is implemented in a structure as shown in FIG. 5. In this case, each resonator is comprised of a membrane (SiN) layer, a bottom electrode (Mo), a piezoelectric layer (AlN) and a top electrode (Mo). A resonant frequency of each resonator is 1.9 GHz which is the frequency standard of a Code Division Multiplexing Access (CDMA) system. In this case, the first to fourth series resonators 54 to 57 are designed to have the same resonant frequency, and the first to third shunt resonators 58 to 60 are designed to have the same resonant frequency. A difference between the resonant frequencies is set to 55 to 60 MHz.

In this case, the combination of the thicknesses of the resonators is shown in Table 1, and the combination of the areas thereof is shown in Table 2.

TABLE 1

|  | Material | Thickness (µm) |
|---|---|---|
| Membrane | SiN | 0.25 |
| Bottom electrode | Mo | 0.3 |
| Piezoelectric layer | AlN | 1.2 |
| Top electrode | Mo | 0.3 |

TABLE 2

| | Resonator No. | | | | | | |
|---|---|---|---|---|---|---|---|
| | 54 | 55 | 56 | 57 | 58 | 59 | 60 |
| Area [µm²] | 43,000 | 34,000 | 34,000 | 43,000 | 21,000 | 14,000 | 21,000 |

In the above conditions, frequency responses are measured with respect to a case where one ends of the first to third shunt resonators 58 to 60 are individually grounded, and cases where the one ends thereof are commonly grounded through inductors of 0.3 nH, 0.6 nH and 0.9 nH, respectively. The above frequency responses are shown in FIG. 6.

Figure 6:
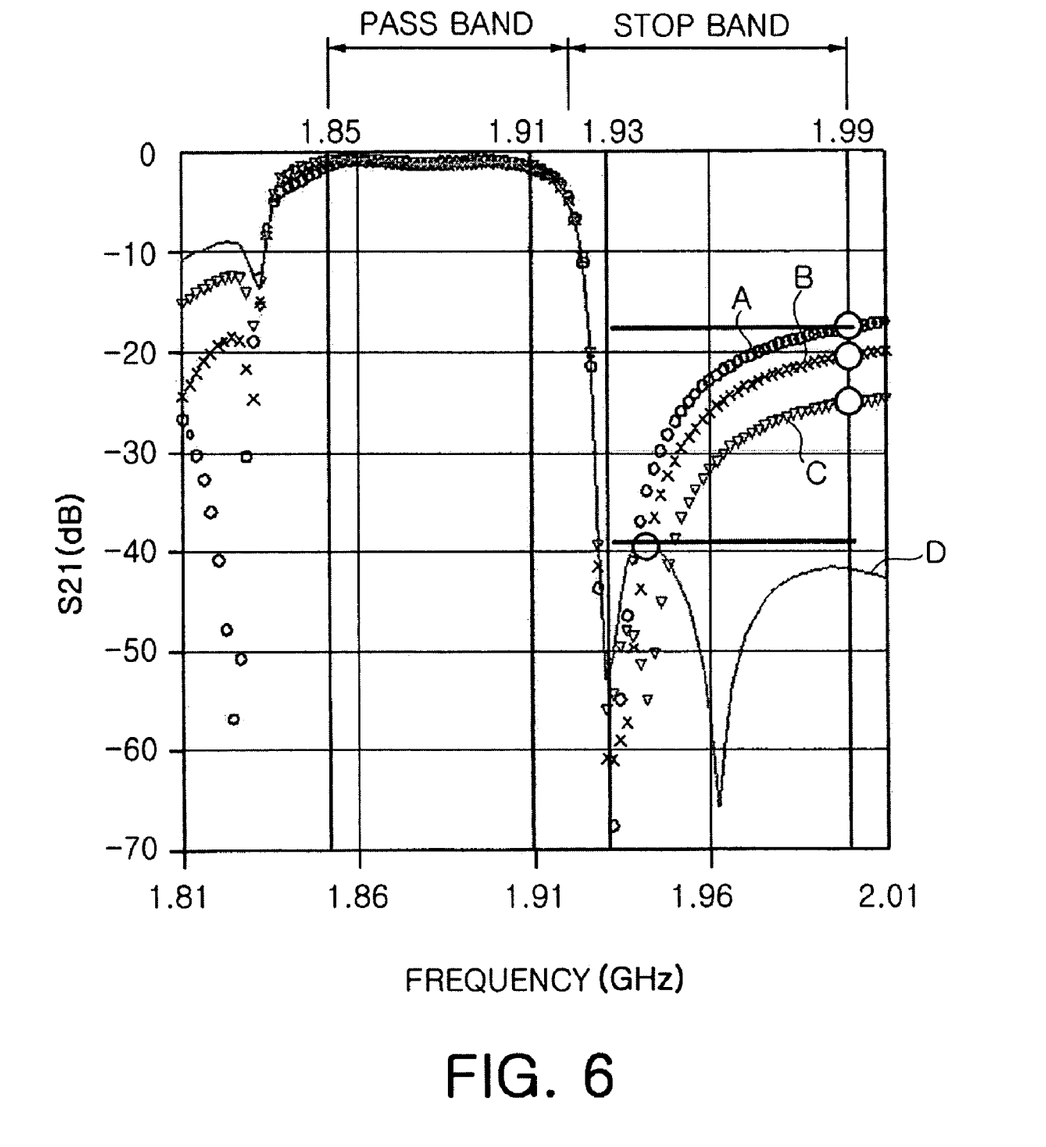
FIG. 6 is a graph showing the frequency characteristics of the ladder-type bulk acoustic wave filter of FIG. 5.

In the graph of FIG. 6, A represents a frequency response curve in the case where the first to third shunt resonators 58 to 60 are individually grounded, and B, C and D represent frequency response curves in the cases where the shunt resonators 58 to 60 are commonly grounded through the inductors of 0.3 nH, 0.6 nH and 0.9 nH, respectively. In the frequency band of 1.93 to 1.99 GHz, it can be seen that an attenuation ratio is approximately 18 dB in the case of the individual grounding, while the attenuation ratio in a high frequency stop band is improved as 21 dB, 26 dB and 39 dB in the case of the common grounding through the inductors. Especially, in the case where the shunt resonators are commonly grounded through the inductor of 0.9 nH, a zero is generated near a frequency of 1.96 GHz, so that attenuation characteristics are remarkably improved in the high frequency stop band. Theses characteristics are generated due to the interaction between the resonators 54 to 60 constituting the bulk acoustic wave filter and the inductor 61 for the common ground. At this time, the inductance of the common ground inductor 61 generating the zero is changed depending on the combinations of the thicknesses and areas of the resonators constituting the filter, but it generally has a small value less than 1 nH. On the other hand, even when the shunt resonators are commonly grounded through the inductor, a waveform variation, that is, an insertion loss, is rarely generated in the pass band of 1.85 to 1.91 GHz. Therefore, the bulk acoustic wave filter of the present invention can obtain low loss and high attenuation characteristics.

Figure 7:
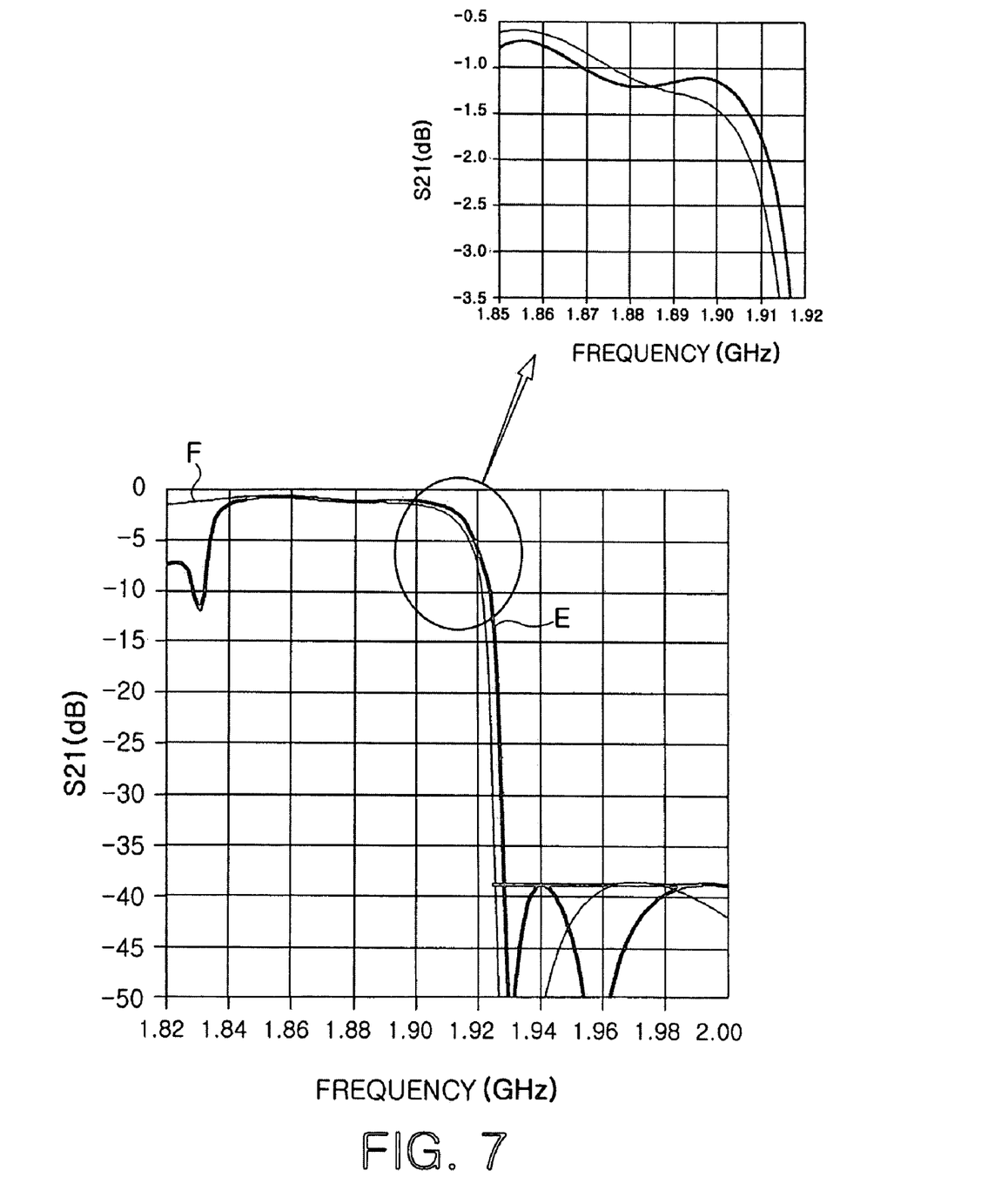
FIG. 7 is a graph comparing the frequency characteristics of the ladder-type bulk acoustic wave filter of the present invention and the conventional ladder-type bulk acoustic wave filter.

In the meantime, a first case where the first to third shunt resonators 58 to 60 are commonly grounded through an inductor of 0.9 nH, and a second case where the shunt resonators 58 to 60 are individually grounded through inductors of 0.5 nH are realized. Further, frequency response characteristics are measured with respect to the above two cases, as shown in FIG. 7. In FIG. 7, E and F represent frequency response characteristic curves in the first case where the shunt resonators are commonly grounded through the inductor of 0.9 nH according to the present invention, and in the second case where the shunt resonators are individually grounded through the inductors of 0.5 nH, respectively. Referring to FIG. 7, it can be seen that attenuation characteristics are similar with respect to the two cases of E and F in a high frequency stop band. However, in the case of the individual grounding, a waveform is changed in a pass band and any attenuation does not occur in a low frequency stop band.

Figure 8A:
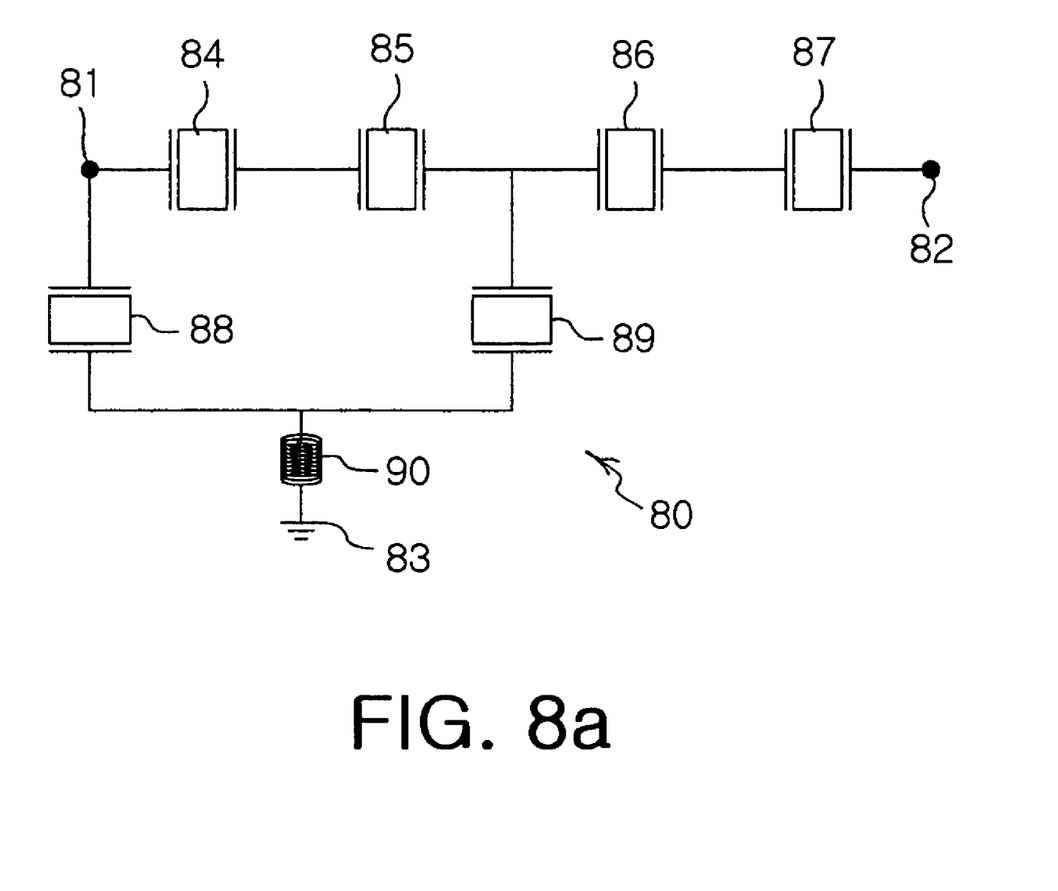
FIG. 8a is a circuit diagram of a ladder-type bulk acoustic wave filter according to another embodiment of the present invention.

FIG. 8a is a circuit diagram of a ladder-type bulk acoustic wave filter according to a second embodiment of the present invention. A ladder-type bulk acoustic wave filter 80 shown in FIG. 8a includes an input terminal 81 for receiving an electrical signal with a certain frequency, an output terminal 82 for outputting an electrical signal including only a passed frequency component within a pass band, a ground terminal 83 connected to the ground, first to fourth series resonators 84 to 87 connected in series between the input and output terminals 81 and 82, a first shunt resonator 88 having one end connected to a contact point of the input terminal 81 and the first series resonator 84, a second shunt resonator 89 having one end connected to a contact point of the second series resonator 85 and the third series resonator 86, and an inductor 90 having one end commonly connected to both the first and second shunt resonators 88 and 89 and the remaining end connected to the ground terminal 83.

Similar to the above-described first embodiment, each of the first to fourth series resonators 84 to 87 and the first and second shunt resonators 88 and 89 is the FBAR in which a piezoelectric dielectric material, such as a ZnO or AlN film, is formed on a semiconductor substrate (wafer), such as silicon or GaAs substrate, to cause resonance due to the piezoelectric characteristics of the film. Each of the resonators 84 to 89 is constructed in such a way that a first electrode, a piezoelectric layer and a second electrode are sequentially superposed on the silicon or GaAs substrate. In addition, each of the resonators 84 to 89 may include a structure (for example, a reflection film structure and an air gap structure) for isolating a resonance area comprised of the first electrode, the piezoelectric layer and the second electrode from the substrate so as to prevent a bulk acoustic wave generated in the piezoelectric layer from being influenced by the substrate.

Moreover, the first to fourth series resonators 84 to 87 and the first and second shunt resonators 88 and 89 may have different resonant frequencies. Further, the band pass characteristics of the resonators 84 to 89 are determined according to poles and zeros generated by the filters 84 to 89. Further, the first and second shunt resonators 88 and 89 are commonly grounded through the inductor 90.

The inductor 90 has an inductance of 1 nH or less, and it can be implemented by a labyrinthine or spiral conductive pattern formed on a surface of a chip of the bulk acoustic wave filter or within the chip. Further, the inductor 90 can be implemented by an embedded conductive pattern (strip line) formed on a package in which the bulk acoustic wave filter is packaged, or a PCB on which the bulk acoustic wave filter is mounted. Further, when the common terminal of the shunt resonators 88 and 89 is wire bonded and connected to a ground terminal of the PCB on which the bulk acoustic wave filter is mounted, the inductor 90 can be implemented using a bonding wire used for the wire bonding. Further, the inductor 90 can be implemented by mounting a lumped element, such as a chip inductor or coil, on the PCB and then electrically connecting the element to the bulk acoustic wave filter on the PCB.

If the inductor 90 is implemented using the conductive pattern formed on the chip or by adjusting the length or thickness of the bonding wire, the bulk acoustic wave filter can be implemented without a significant increase in the size thereof compared to a conventional bulk acoustic wave filter.

EXPERIMENT EXAMPLE 2

The bulk acoustic wave filter having the construction of FIG. 8*a* is implemented using four series resonators and two shunt resonators. At this time, the combination of the thicknesses of the resonators is set as shown in Table 1 of the first experiment example, and the combination of the areas thereof is set as shown in Table 3.

TABLE 3

| | Resonator No. | | | | | |
|---|---|---|---|---|---|---|
| | 84 | 85 | 86 | 87 | 88 | 89 |
| Area [µm$^2$] | 33,000 | 33,000 | 40,000 | 40,000 | 23,000 | 38,000 |

Figure 8B:
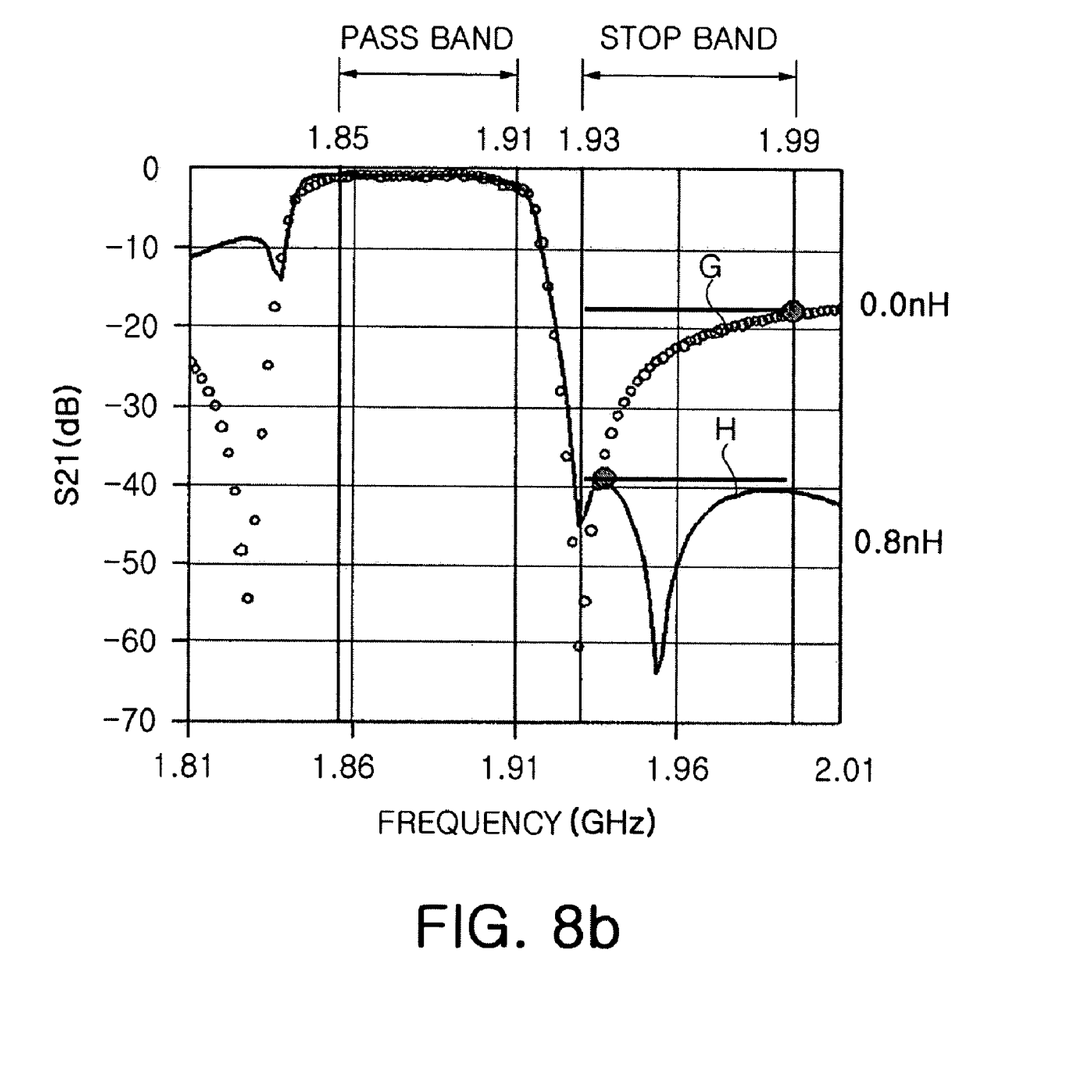

FIG. 8*b* is a graph comparing the frequency response characteristics measured with respect to a first case where the first and second shunt resonators 88 and 89 are individually grounded, and a second case where they are commonly grounded through the inductor 90 of 0.8 nH, after the above-described bulk acoustic wave filter is implemented. Similar to the first experiment example, it can be seen that the first case where the first and second shunt resonators 88 and 89 are commonly grounded through a certain inductance shows better attenuation characteristics in a high frequency stop band and does not show high insertion loss degradation in a pass band of 1.85 to 1.91 GHz, compared to the second case where the shunt resonators 88 and 89 are individually grounded.

From the above experiments, it can be seen that the bulk acoustic wave filter of the present invention is suitable for a transmission stage filter requiring high attenuation characteristics in a high frequency stop band.

As described above, the present invention provides a ladder-type bulk acoustic wave filter with a common ground inductor, in which shunt resonators are commonly grounded through a suitable inductance, so that attenuation characteristics are improved in a high frequency stop band without insertion loss degradation of a pass band, thus implementing a transmission stage filter having low loss and high attenuation characteristics.

Further, the bulk acoustic wave filter of the present invention is advantageous in that a filter having low loss and high attenuation characteristics can be implemented only using a single inductor with a low inductance, so that the filter can be simply produced and implemented to have a small size.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A ladder-type bulk acoustic wave filter, comprising:
an input terminal;
an output terminal;
a ground terminal;
a plurality of series resonators connected in series between the input terminal and the output terminal;
a plurality of shunt resonators each having a first end and a second end, each of the first ends of said shunt resonators being connected to a contact point of the series resonators, the second ends of said shunt resonators being commonly connected to a common terminal; and
a common ground inductor connecting the common terminal of said shunt resonators to the ground terminal;
wherein the common ground inductor is a conductive pattern formed on a package of the bulk acoustic wave filter or a printed circuit board on which the bulk acoustic wave filter is mounted.

2. The ladder-type bulk acoustic wave filter according to claim 1, wherein
said series resonators comprise first to fourth series resonators which are sequentially connected in series between the input and output terminals; and
said shunt resonators comprise first and second shunt resonators, the first end of the first shunt resonator is connected to a first contact point of the input terminal and the first series resonator, and the first end of the second shunt resonator is connected to a second contact point of the second and third series resonators.

3. A ladder-type bulk acoustic wave filter, comprising:
an input terminal;
an output terminal;
a ground terminal;
a plurality of series resonators connected in series between the input terminal and the output terminal;
a plurality of shunt resonators each having a first end and a second end, each of the first ends of said shunt resonators being connected to a contact point of the series resonators, the second ends of said shunt resonators being commonly connected to a common terminal; and
a common ground inductor connecting the common terminal of said shunt resonators to the ground terminal;
wherein the common ground inductor is a lumped element.

4. The ladder-type bulk acoustic wave filter according to claim 3, wherein said series resonators comprise first to fourth series resonators which are sequentially connected in series between the input and output terminals; and said shunt resonators comprise first and second shunt resonators, the first end of the first shunt resonator is connected to a first contact point of the input terminal and the first series resonator, and the first end of the second shunt resonator is connected to a second contact point of the second and third series resonators.

5. A ladder-type bulk acoustic wave filter, comprising:

an input terminal;

an output terminal;

a ground terminal;

a plurality of series resonators connected in series between the input terminal and the output terminal;

a plurality of shunt resonators each having a first end and a second end, each of the first ends of said shunt resonators being connected to a contact point of the series resonators, the second ends of said shunt resonators being commonly connected to a common terminal; and a common ground inductor connecting the common terminal of said shunt resonators to the ground terminal;

wherein said series resonators comprise first to fourth series resonators which are sequentially connected in series between the input and output terminals; and said shunt resonators comprise first and second shunt resonators, the first end of the first shunt resonator is connected to a first contact point of the input terminal and the first series resonator, and the first end of the second shunt resonator is connected to a second contact point of the second and third series resonators.

* * * * *